(12) United States Patent
Lee et al.

(10) Patent No.: US 7,649,195 B2
(45) Date of Patent: Jan. 19, 2010

(54) LIGHT EMITTING DIODE HAVING ACTIVE REGION OF MULTI QUANTUM WELL STRUCTURE

(75) Inventors: Dong Seon Lee, Ansan-si (KR); Gyu Beom Kim, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 43 days.

(21) Appl. No.: 12/137,708

(22) Filed: Jun. 12, 2008

(65) Prior Publication Data

US 2008/0308787 A1 Dec. 18, 2008

(30) Foreign Application Priority Data

Jun. 12, 2007 (KR) .................. 10-2007-0057260
Jun. 25, 2007 (KR) .................. 10-2007-0062465
Jul. 30, 2007 (KR) .................. 10-2007-0076477

(51) Int. Cl.
  *H01L 31/00* (2006.01)
(52) U.S. Cl. .................. 257/13; 257/97; 257/E33.027; 257/E33.028; 257/E33.008
(58) Field of Classification Search .................. 257/13, 257/E33.027, E33.028, E33.008
See application file for complete search history.

(56) References Cited

U.S. PATENT DOCUMENTS 5,473,173 A * 12/1995 Takiguchi et al. ........... 257/185

FOREIGN PATENT DOCUMENTS

KR  10-2006-0031582  4/2006

* cited by examiner

*Primary Examiner*—Zandra Smith
*Assistant Examiner*—Paul E Patton
(74) *Attorney, Agent, or Firm*—H.C. Park & Associates, PLC

(57) ABSTRACT

Disclosed is a light emitting diode (LED) having an active region of a multiple quantum well structure in which well layers and barrier layers are alternately laminated between a GaN-based N-type compound semiconductor layer and a GaN-based P-type compound semiconductor layer. The LED includes a middle barrier layer having a bandgap relatively wider than the first barrier layer adjacent to the N-type compound semiconductor layer and the n-th barrier layer adjacent to the P-type compound semiconductor layer. The middle barrier layer is positioned between the first and n-th barrier layers. Accordingly, positions at which electrons and holes are combined in the multiple quantum well structure to emit light can be controlled, and luminous efficiency can be enhanced. Furthermore, an LED is provided with enhanced luminous efficiency using a bandgap engineering or impurity doping technique.

29 Claims, 10 Drawing Sheets (a)

(b)

US 7,649,195 B2

LIGHT EMITTING DIODE HAVING ACTIVE REGION OF MULTI QUANTUM WELL STRUCTURE

CROSS REFERENCE TO RELATED APPLICATIONS

This application claims priority from and the benefit of Korean Patent Application No. 10-2007-0057260, filed on Jun. 12, 2007, Korean Patent Application No. 10-2007-0062465, filed on Jun. 25, 2007, and Korean Patent Application No. 10-2007-0076477, filed on Jul. 30, 2007, all of which are hereby incorporated by reference for all purposes as if fully set forth herein.

BACKGROUND OF THE INVENTION

1. Field of the Invention

The present invention relates to a light emitting diode, and more particularly, to a light emitting diode having an active region of a multi quantum well structure.

2. Discussion of the Background

In general, since Group III element nitrides, such as GaN, AlN and InGaN, have excellent thermal stability and a direct transition type energy band structure, they have recently come into the spotlight as materials for light emitting diodes (LEDs) in blue and ultraviolet regions. Particularly, an InGaN compound semiconductor has been noticed for its narrow band gap. LEDs using such a GaN-based compound semiconductor are used in various applications such as large-sized full-color flat panel displays, backlight sources, traffic lights, indoor illumination, high density light sources, high resolution output systems and optical communications.

FIG. 1 is a sectional view illustrating a conventional LED having an active region of a multi quantum well structure, and FIG. 2 is a schematic band diagram illustrating the active region of the multi quantum well structure of the LED of FIG. 1.

Referring to FIGS. 1 and 2, an LED comprises an N-type semiconductor layer 17, a P-type semiconductor layer 23 and an active region 19 interposed between the N-type and P-type semiconductor layers 17 and 23. In order to increase recombination efficiency of electrons and holes, a P-type clad layer or blocking layer 21 having a relatively wide bandgap may be interposed between the P-type semiconductor layer 23 and the active region 19, and an N-type clad layer (not shown) may be interposed between the N-type semiconductor layer 17 and the active region 19.

The N-type and P-type semiconductor layers comprise Group III element nitride semiconductor layers, i.e., (Al, In, Ga)N-based compound semiconductor layers. The active region 19 is generally formed to have a multiple quantum well structure in which well layers 19a and barrier layers 19b are alternately laminated. In an InGaN LED, an active region of a multiple quantum well structure is generally formed by alternately laminating InGaN well layers 19a and GaN barrier layers 19b. The well layer 19a comprises a semiconductor layer with a smaller band gap than the N-type and P-type semiconductor layers 17 and 19 and the barrier layer 19b, thereby providing quantum wells in which electrons and holes are recombined.

Such a Group III element nitride semiconductor layer is grown on a heterogeneous substrate 11 with a hexagonal system structure, such as sapphire or SiC, by a method, such as organic chemical vapor deposition (MOCVD). However, if a Group III element nitride semiconductor layer is grown on the heterogeneous substrate 11, a crack or warpage occurs in the semiconductor layer and dislocation is produced due to the difference of lattice coefficients and thermal expansion coefficients between the semiconductor layer and the substrate.

In order to prevent these problems, a buffer layer is formed on the substrate 11, wherein the buffer layer generally includes a low temperature buffer layer 13 and a high temperature buffer layer 15. The low temperature buffer layer 13 is generally formed of $Al_xGa_{1-x}N(0 \leq x \leq 1)$ at a temperature of 400 to 800° C. by a method, such as MOCVD. The high temperature buffer layer 15 is then formed on the low temperature buffer layer 13. The high temperature buffer layer 15 is formed of GaN at a temperature of 900 to 1200° C.

The conventional LED employs a multiple quantum well structure, so that the luminous efficiency thereof can be more improved than that of an LED with a single quantum well structure. In addition, the conventional LED employs the P-type clad layer or blocking layer 21, so that the recombination efficiency can be increased. However, since mobility of electrons is about 100 times as high as that of holes, electrons move within the multiple quantum well structure relatively faster than holes, and therefore, positions at which electrons and holes are recombined are concentrated in the vicinity of the P-type clad layer 21. The P-type clad layer 21 is formed of AlGaN having a relatively wide bandgap. Thus, since the P-type clad layer 21 has large lattice mismatch with respect to GaN or InGaN and contains an impurity such as Mg, a large quantity of crystal defects exist between the P-type clad layer 21 and the active region 19. Such crystal defects cause non-light emitting recombination, thereby decreasing luminous efficiency of the LED.

In order to improve luminous efficiency through recombination of electrons and holes as compared with the non-light emitting recombination, a well layer is disposed as the uppermost layer of the multiple quantum well structure, so that the well layer 19a can be in contact with the P-type clad layer 21. Accordingly, it is expected that electrons concentrated in the vicinity of the P-type clad layer 21 are combined with holes in the uppermost one of the well layers 19a, thereby improving luminous efficiency. However, since the lattice mismatch between the uppermost well layer 19a and the P-type clad layer 21 is more increased than that between the barrier layer 19b and the P-type clad layer 21, crystal defects in the vicinity of the P-type clad layer 21 are increased, and therefore, increasing the luminous efficiency is difficult.

FIGS. 3 and 4 are band diagrams illustrating another problem of a conventional LED having an active region of a multi quantum well structure. FIG. 3(a) simply shows a band diagram of respective layers, and FIG. 3(b) shows a band diagram in an equilibrium state. FIG. 4 is a schematic band diagram when a forward voltage is applied to the conventional LED of FIG. 3. Here, three barrier layers and three well layers are alternately laminated for convenience of illustration (it is noted that the positions of N-type and P-type semiconductor layers 17 and 23 are opposite to those of FIG. 2).

Referring to FIG. 3, the LED includes an N-type semiconductor layer 17 and a P-type semiconductor layer 23 and an active region 19 interposed between the N-type and P-type semiconductor layers 17 and 23 as described with reference to FIGS. 1 and 2. In order to increase recombination efficiency of electrons and holes, a blocking layer 21 having a relatively wide bandgap is interposed between the P-type semiconductor layer 23 and the active region 19.

Here, since polarization is generated by a piezo electric field in an active region formed of GaN-based layers, bands of the well layers 19*a* are inclined in a direction different from those of the barrier layers 19*b*, considering polarization in FIG. 3(*b*).

Referring to FIG. 4, when a forward voltage $V_F$ is applied to the LED, bands of the N-type semiconductor layer 17 are moved up. When a forward bias that is similar to or higher than the bandgap of the P-type semiconductor layer 23 is applied to the LED, the conduction band Ec of the N-type semiconductor layer 17 is positioned higher than that of the P-type semiconductor layer 23. At this time, the closer the barrier layer 19*b* in the active region is positioned to the N-type semiconductor layer 17, the higher its conduction band is positioned, as shown in this figure. The arrangement of the bands of barrier layers 19*b* provides driving force for allowing carriers injected from the N-type semiconductor layer 17 not to be subjected to recombination in the active region 19 but to flow into the P-type semiconductor layer, which accordingly causes carrier overflow to occur as shown by a dotted line arrow. The excessive occurrence of such carrier overflow causes the recombination rate of electrons and holes to deteriorate, thereby decreasing luminous efficiency.

Meanwhile, the blocking layer 21 is employed in order to decrease carrier overflow. The blocking layer 21 is formed of a semiconductor having a wider bandgap to prevent carrier overflow. However, the blocking layer 21 formed of the semiconductor having a wider bandgap has increased lattice mismatch with the P-type semiconductor layer 23, and thus, the crystalline quality of the P-type semiconductor layer 23 grown on the blocking layer 21 deteriorates. Therefore, there is a certain limit to preventing carrier overflow using the blocking layer 21.

As applications of LEDs such as general illumination are extended, the forward voltage $V_F$ applied to an LED is not limited to a conventional forward voltage of 3V or so but is continuously increased. Therefore, in an LED operated under high voltage (or high current), developing a new technique for preventing carrier overflow besides the blocking layer 21 is required.

Meanwhile, a technique for doping a barrier layer with an n-type impurity is used to reduce polarization generated by a piezo electric field. However, the n-type impurity doping causes a surface of the barrier layer to be rough, whereby the crystalline quality of the barrier and well layers may deteriorate, and the barrier and well layers are prevented from forming with a uniform thickness. Therefore, improving the crystalline quality of the barrier layer while reducing polarization generated by the piezo electric field is required.

SUMMARY OF THE INVENTION

This invention provides an LED with improved luminous efficiency by increasing recombination rate of electrons and holes.

The present invention also provides an LED with improved luminous efficiency by controlling positions at which electrons and holes are recombined in a multiple quantum well structure.

The present invention also provides an LED, wherein recombination rate of electrons and holes can be increased at a central portion of a multiple quantum well structure.

The present invention also provides an LED, wherein the recombination rate of electrons and holes can be improved by reducing carrier overflow.

The present invention also provides an LED, in which carrier overflow can be reduced under high voltage.

The present invention also provides an active region of a multiple quantum well structure, wherein recombination rate of electrons and holes can be increased and crystalline quality is excellent by reducing polarization generated by a piezo electric field.

Additional features of the invention will be set forth in the description that follows, and in part will be apparent from the description, or may be learned by practice of the invention.

The present invention for achieving these objects provides an LED having an active region of a multiple quantum well structure in which well layers and barrier layers are alternately laminated between a GaN-based N-type compound semiconductor layer and a GaN-based P-type compound semiconductor layer. There is provided an LED with enhanced luminous efficiency in which a bandgap engineering or impurity doping technique is applied to barrier layers in the active region of the multiple quantum well structure.

In a first embodiment of the present invention, the LED includes a middle barrier layer having a bandgap relatively wider than a first barrier layer adjacent to the N-type compound semiconductor layer and a n-th barrier layer adjacent to the P-type compound semiconductor layer. The middle barrier layer is positioned between the first and n-th barrier layers. Positions at which electrons and holes are recombined in the multiple quantum well structure can be controlled by adjusting a speed of electrons. Accordingly, non-light emitting recombination generated in the vicinity of the P-type compound semiconductor layer or P-type clad layer is decreased, so that luminous efficiency of the LED can be enhanced.

One or more barrier layers may exist between the first and n-th barrier layers, and the middle barrier layer may be positioned at any position between the first and n-th barrier layers. For example, the middle barrier layer may be positioned at a central portion between the first and n-th barrier layers. In this case, the positions at which electrons and holes are recombined are moved toward the center of the multiple quantum well structure, thereby enhancing luminous efficiency.

Other middle barrier layer having a bandgap relatively wider than the first and n-th barrier layers may be positioned between the first barrier layer and the middle barrier layer. That is, a plurality of middle barrier layers may be positioned between the first and n-th barrier layers, and such middle barrier layers restrict the movement of electrons to control recombination positions of electrons and holes.

Meanwhile, at least one barrier layer having a bandgap relatively narrower than the middle barrier layer and the other middle barrier layer may be positioned between the middle barrier layer and the other middle barrier layer. Accordingly, the recombination rate of electrons and holes is increased between the middle barrier layer and the other middle barrier layer. Also, the other middle barrier layer may have the same bandgap as the middle barrier layer. However, the other middle barrier layer is not limited thereto but may have a bandgap relatively narrower than the middle barrier layer.

In the first embodiment of the present invention, the first and n-th barrier layers may be formed of $In_xAl_yGa_zN$ ($0<x<1$, $0\leq y<1$, $0<z<1$) or GaN, and the middle barrier layer or the other middle barrier layer may be formed of AlGaN.

Meanwhile, the middle barrier layer or the other middle barrier layer may have a laminated structure in which a layer having a relatively wide bandgap is interposed between layers having a relatively narrow bandgap. Here, the entire bandgap of the laminated structure is defined by the relatively wide bandgap. Such a laminated structure reduces lattice mismatch between the layer having a relatively wide bandgap and the well layers adjacent thereto, thereby preventing occurrence of crystal defects.

In addition, each of the layers having a relatively narrow bandgap is formed of $In_xAl_yGa_zN$ ($0<x<1$, $0\leq y<1$, $0<z<1$) or GaN, and the layer having a relatively wide bandgap may be formed of AlGaN.

In the first embodiment of the present invention, at least one of the barrier layers comprises a first region doped with an n-type impurity and an undoped second region. The barrier layer comprises the region doped with an n-type impurity and the undoped region, so that polarization generated by a piezo electric field can be reduced and the entire concentration of the n-type impurity with which the barrier layer is doped can be decreased, thereby improving the crystalline quality of the barrier and well layers.

The first region may be formed at one surface side of the barrier layer, and the second region may be formed at the other surface side of the barrier layer. That is, the first region may be formed adjacent to one surface of the barrier layer, and the second region may be formed adjacent to the other surface of the barrier layer.

The one surface of the barrier layer may be facing to the P-type compound semiconductor layer, and the other surface of the barrier layer may be facing to the N-type compound semiconductor layer. The first region may have an increasing concentration of the doped n-type impurity toward the one surface of the barrier layer.

Meanwhile, the first regions may be respectively formed adjacent to one and the other surface sides of the barrier layer and the second region may be formed between the first regions.

The thickness of the second region may be 1.5 to 20 times as thicker as that of the first region.

In the first embodiment of the present invention, the n-th barrier layer may be adjacent to the P-type compound semiconductor layer and may have the first and second regions. The LED may include a barrier layer having first and second regions besides the n-th barrier layer. The first region of the n-th barrier layer may have an impurity concentration lower than the first region of the barrier layer having the first and second regions.

In a second embodiment of the present invention, as the barrier layer in the active region is closer to the N-type compound semiconductor layer, the barrier layer may have a narrower bandgap. Driving force for moving carriers can be removed or reduced by the arrangement of bands of these barrier layers, thereby reducing carrier overflow.

When a forward operation voltage is applied, the bandgap of the barrier layers can be controlled so that conduction bands of the barrier layers are positioned at the generally same energy level. Accordingly, when a forward operation voltage is applied, the band slope of the barrier layers can be substantially removed.

Meanwhile, the barrier layers may be formed of $Al_xIn_yGa_{1-x-y}N$ ($0\leq x$, $y<1$, $0\leq x+y<1$). Thus, by varying the composition ratio of Al and/or In, the barrier layer can be formed to have a narrower bandgap as the barrier layer is positioned closer to the N-type compound semiconductor layer. In addition, the well layers may be formed of InGaN.

Meanwhile, a blocking layer may be interposed between the P-type compound semiconductor layer and the active region. The blocking layer restricts movement of electrons and thus helps electrons and holes to be recombined in the active region.

In the second embodiment of the present invention, at least one of the barrier layers comprises at lease one first region doped with an n-type impurity and an undoped second region. The barrier layer comprises the region doped with an n-type impurity and the undoped region, so that polarization generated by a piezo electric field can be reduced and the entire concentration of the n-type impurity doped into the barrier layer can be decreased, thereby improving the crystalline quality of the barrier layer and well layer.

The first region may be formed at one surface side of the barrier layer, and the second region may be formed at the other surface side of the barrier layer. That is, the first region may be formed adjacent to one surface of the barrier layer, and the second region may be formed adjacent to the other surface of the barrier layer.

The one surface of the barrier layer may be facing to the P-type compound semiconductor layer, and the other surface of the barrier layer may be facing to the N-type compound semiconductor layer. The first region may have an increasing concentration of the doped n-type impurity toward the one surface of the barrier layer.

Meanwhile, the first regions may be respectively formed adjacent to one and the other surface sides of the barrier layer, and the second region may be formed between the first regions.

The thickness of the second region may be 1.5 to 20 times as thicker as that of the first region.

In the second embodiment of the present invention, the LED may include a first barrier layer adjacent to the P-type compound semiconductor layer and having first and second regions, and a second barrier layer having first and second regions besides the first barrier layer. The first region of the first barrier layer may have an impurity concentration lower than the first region of the second barrier layer.

The foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
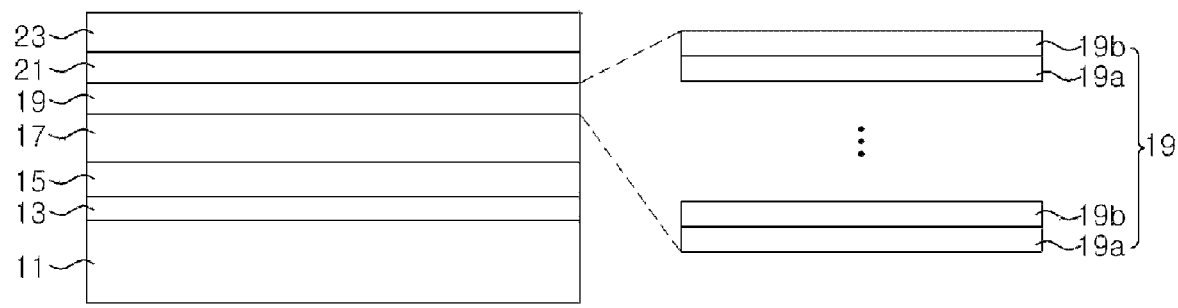
FIG. 1 is a sectional view illustrating a conventional LED having an active region of a multi quantum well structure.
Figure 2:
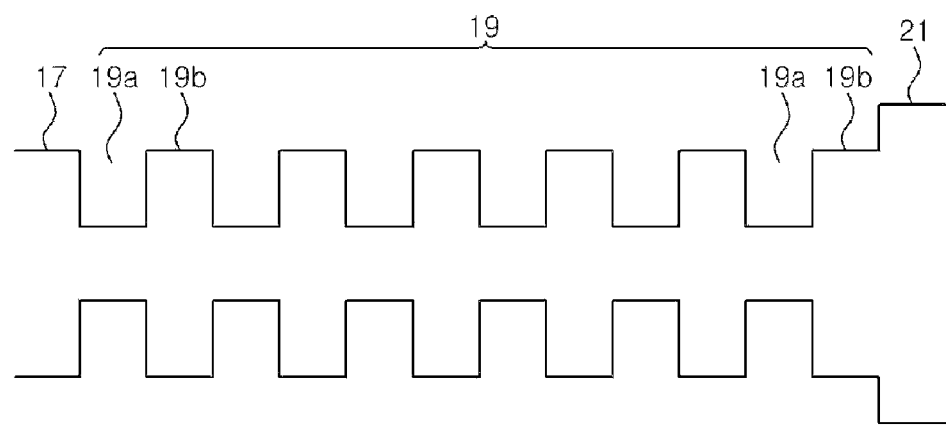
FIG. 2 is a schematic band diagram illustrating the conventional LED having the active region of the multi quantum well structure.
Figure 3:
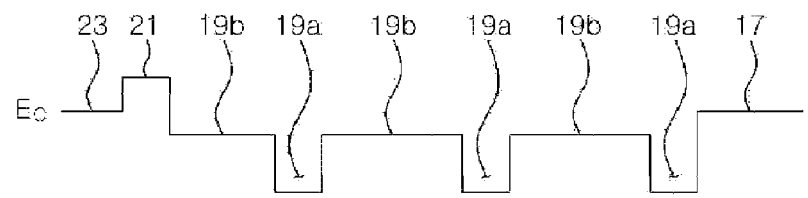
FIG. 3 shows schematic band diagrams illustrating a conventional LED having an active region of a multi quantum well structure.
Figure 3:
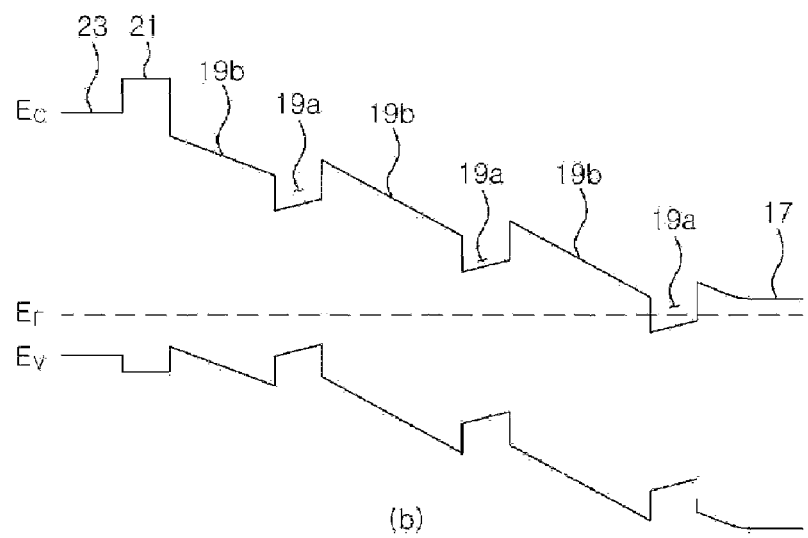

Hereinafter, embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 5:
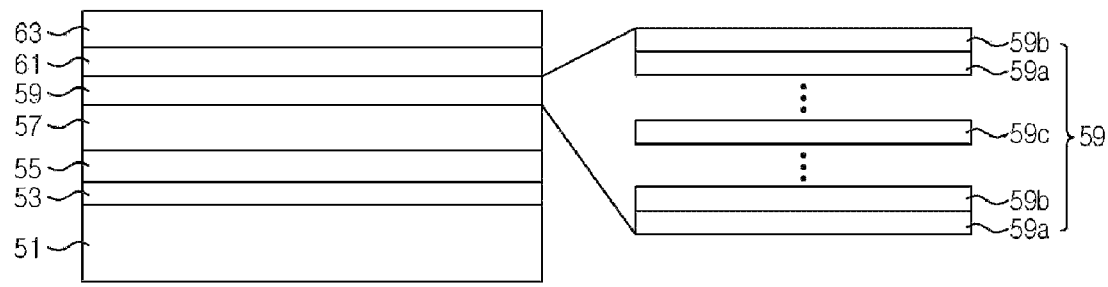
FIG. 5 is a sectional view illustrating an LED having an active region of a multi quantum well structure according to a first embodiment of the present invention.
Figure 6:
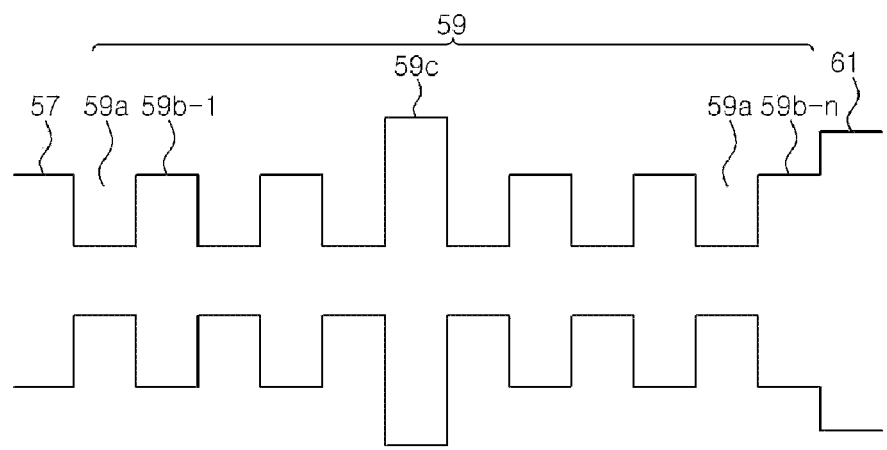
FIG. 6 is a band diagram illustrating the active region of the multi quantum well structure according to the first embodiment of the present invention.

FIG. 5 is a sectional view illustrating an LED having an active region of a multi quantum well structure according to a first embodiment of the present invention, and FIG. 6 is a band diagram illustrating the active region of the multi quantum well structure according to the first embodiment of the present invention.

Referring to FIG. 5, an N-type compound semiconductor layer 57 is positioned on a substrate 51. In addition, a buffer layer may be interposed between the substrate 51 and the N-type compound semiconductor layer 57 and include a low temperature buffer layer 53 and a high temperature buffer layer 55. The substrate 51 is not particularly limited, but may be, for example, a sapphire substrate, a spinel substrate, a SiC substrate, or the like. Meanwhile, the low temperature buffer layer 53 may be generally formed of $Al_xGa_{1-x}N(0 \leq x \leq 1)$, and the high temperature buffer layer 55 may be formed of, for example, undoped GaN or n-type GaN doped with n-type impurities.

A P-type compound semiconductor layer 63 is positioned above the N-type compound semiconductor layer 57, and an active region 59 is interposed between the N-type and P-type compound semiconductor layers 57 and 63. The N-type compound semiconductor layer and the P-type compound semiconductor layer include (Al, In, Ga)N-based Group-III nitride semiconductor layers. For example, the N-type and P-type compound semiconductor layers 57 and 63 may be N-type and P-type GaNs or N-type and P-type AlGaNs, respectively. In addition, a P-type clad layer or blocking layer 61 may be interposed between the P-type compound semiconductor layer 63 and the active region 59. The P-type clad layer 61 may also be formed of an (Al, In, Ga)N-based Group-III nitride semiconductor, e.g., AlGaN. Although not shown, an N-type clad layer may be interposed between the N-type compound semiconductor layer 57 and the active region 59.

Meanwhile, the active region 59 has a multiple quantum well structure in which well layers 59a and barrier layers 59b are alternately laminated. The well layers 59a may be formed of (Al, In, Ga)N, and a composition element and a composition range of the well layers 59a may be selected depending on the desired wavelength of light. For example, the well layers 59a may be formed of InGaN. The barrier layers 59b may be formed of $In_xAl_yGa_zN$ (0<x<1, 0≦y<1, 0<z<1) or GaN. Although the well layer 59a is shown in contact with the N-type compound semiconductor layer 57, the barrier layer 59b may be in contact therewith. Further, although the barrier layer 59b is shown in contact with the P-type clad layer 61, the well layer 59a may be in contact therewith.

The active region 59 includes a middle barrier layer 59c having a bandgap relatively wider than the barrier layers 59b. The middle barrier layer 59c may be formed of (Al, In, Ga)N, e.g., AlGaN. The active region 59 of the multiple quantum well structure including the middle barrier layer 59c will be described in detail with reference to FIG. 6.

Referring to FIG. 6, the active region 59 of the multiple quantum well structure is positioned between the N-type compound semiconductor layer 57 and the P-type compound semiconductor layer 63 (or P-type clad layer 61). The active region 59 is formed by alternately laminating the well layers 59a having a relatively narrow bandgap and the barrier layers 59b having a relatively wide bandgap. For convenience of illustration, the barrier layer adjacent to the N-type compound semiconductor layer 57 is defined as a first barrier layer 59b-1, and the barrier layer adjacent to the P-type compound semiconductor layer 63 (or P-type clad layer 61) is defined as an n-th barrier layer 59b-n.

Among these barrier layers, the middle barrier layer 59c having a bandgap relatively wider than the first and n-th barrier layers is positioned between the first barrier layer 59b-1 and the n-th barrier layer 59b-n. The middle barrier layer 59c has a relative wide bandgap, so that if electrons introduced from the N-type compound semiconductor layer 57 pass through the active region 59, the movement of the electrons is restricted. Accordingly, the positions at which electrons and holes are recombined can be controlled by the middle barrier layer 59c. For example, if the middle barrier layer 59c is positioned at the central portion between the first and n-th barrier layers, the positions at which electrons and holes are recombined can be moved toward the center of the multiple quantum well structure.

As the positions at which electrons and holes are recombined may be moved inside of the multiple quantum well structure, preventing electrons from being concentrated in the vicinity of the P-type clad layer 61 is possible. Accordingly, non-light emitting recombination is decreased, so that luminous efficiency can be enhanced.

Meanwhile, in addition to the middle barrier layer 59c, other middle barrier layer having a bandgap relatively wider than the first and n-th barrier layers may be positioned in the multiple quantum well structure. This will be described in detail with reference to FIGS. 7 and 8.

Figure 7:
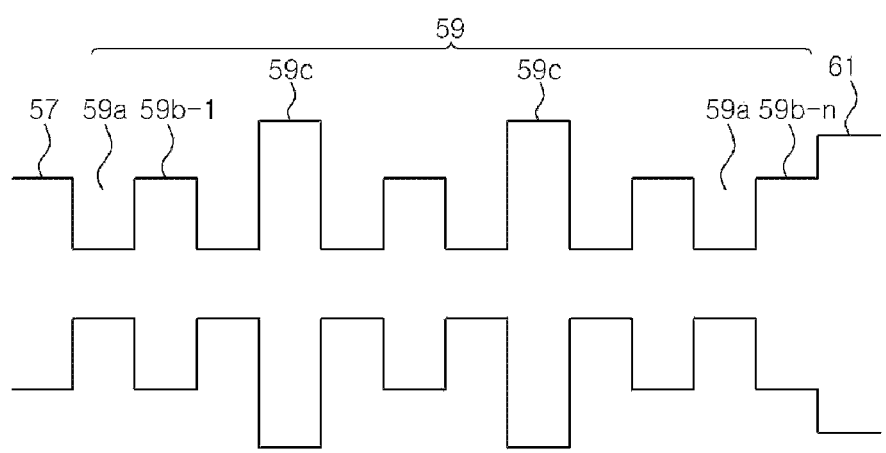
FIG. 7 is a band diagram illustrating an active region of a multi quantum well structure according to a modification of the first embodiment of the present invention.

FIG. 7 is a band diagram illustrating an active region of a multi quantum well structure according to a modification of the first embodiment of the present invention.

Referring FIG. 7, a middle barrier layer 59c having a bandgap relatively wider than the first and n-th barrier layers 59b-1 and 59b-n is positioned therebetween as described with reference to FIG. 6. In addition thereto, other middle barrier layer 59c' having a bandgap relatively wider than the first and n-th barrier layers 59b-1 and 59b-n is positioned therebetween. The other middle barrier layer 59c' may be positioned between the first barrier layer 59b-1 and the middle barrier layer 59c.

Like the middle barrier layer 59c, the other middle barrier layer 59c' has a relatively wide bandgap and therefore restricts the movement of electrons. Particularly, if the other middle barrier layer 59c' is disposed close to the middle barrier layer 59c, the recombination rate of electrons and holes is more increased. In addition, as shown in this figure, at least one of barrier layers having a bandgap relatively narrower than the middle barriers 59c and 59c' may be interposed therebetween. Accordingly, the recombination rate of electrons and holes can be increased between the middle barrier layer 59c and the other middle barrier layer 59c'.

Figure 8:
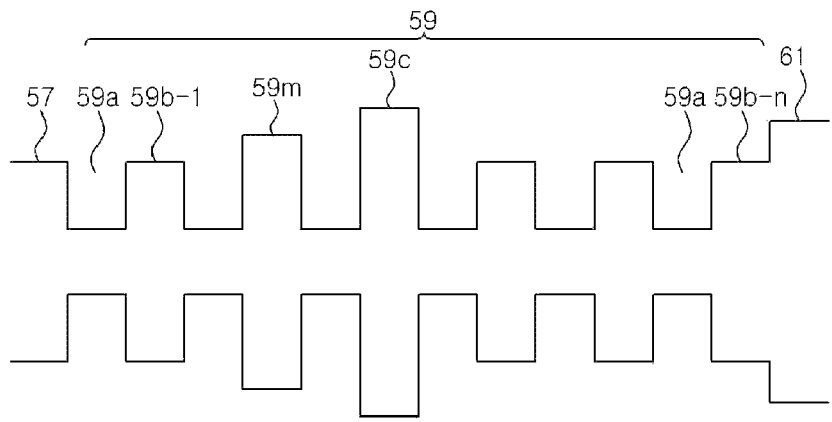
FIG. 8 is a band diagram illustrating an active region of a multi quantum well structure according to another modification of the first embodiment of the present invention.

The other middle barrier layer 59c' may be formed of a material having the same composition and composition ratio as the middle barrier layer 59c, e.g., AlGaN, but is not limited thereto. That is, the other middle barrier layer 59c' may be formed of (Al, In, Ga)N having another composition and composition ratio. For example, as shown in FIG. 8, other middle barrier layer 59m having a bandgap relatively narrower than the middle barrier layer 59c may be interposed between the first barrier layer 59b-1 and the middle barrier layer 59c.

Figure 9:
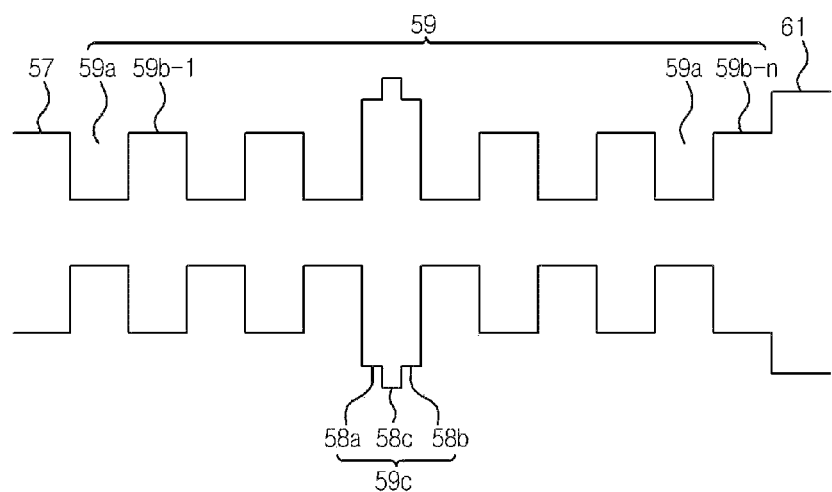
FIG. 9 is a band diagram illustrating a middle barrier layer according to a further modification of the first embodiment of the present invention.

As described above, the middle barrier layer 59c or the other middle barrier layer 59c' or 59m may be formed to have a single-layered structure, but are not limited thereto. For example, as shown in FIG. 9, the middle barrier layer 59c and/or the other middle barrier layer 59c' or 59m may have a laminated structure in which a layer 58c having a relatively wide bandgap is interposed between layers 58a and 58b having a relatively narrow bandgap. For example, each of the layers 58a and 58b having a relatively narrow bandgap may be formed of $In_xAl_yGa_zN$ ($0<x<1$, $0\leq y<1$, $0<z<1$) or GaN, and the layer 58c having a relatively wide bandgap may be formed of AlGaN.

Such a laminated structure reduces lattice mismatch between the middle barrier layer 59c or the other middle barrier layer and the well layers 59a adjacent thereto, thereby preventing occurrence of crystal defects.

In these embodiments, the first and n-th middle barrier layers may have the same bandgap. The first and n-th middle barrier layers are not limited thereto, but may have different bandgaps. The active region 59 of the multiple quantum well structure may further include a barrier layer in addition to the first and n-th barrier layers and also, a middle barrier layer in addition to the middle barrier layer or the other middle barrier layer.

Meanwhile, the barrier layers may be doped with an n-type impurity. The doping with such an n-type impurity may be limited to a region of the barrier layer. The doping of a region of a barrier layer with an n-type impurity will be described in detail later.

Figure 10:
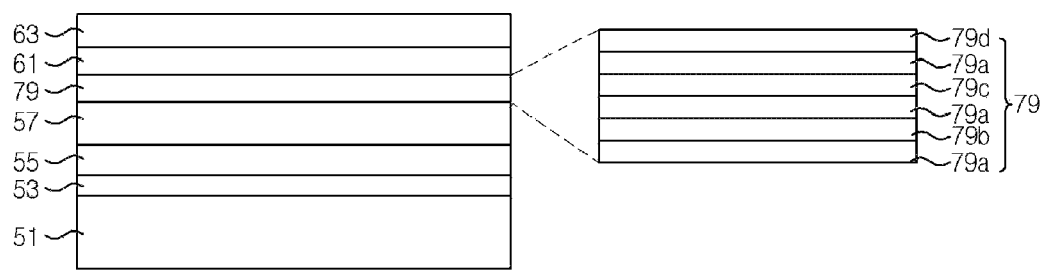
FIG. 10 is a sectional view illustrating an LED having an active region of a multi quantum well structure according to a second embodiment of the present invention.
Figure 11:
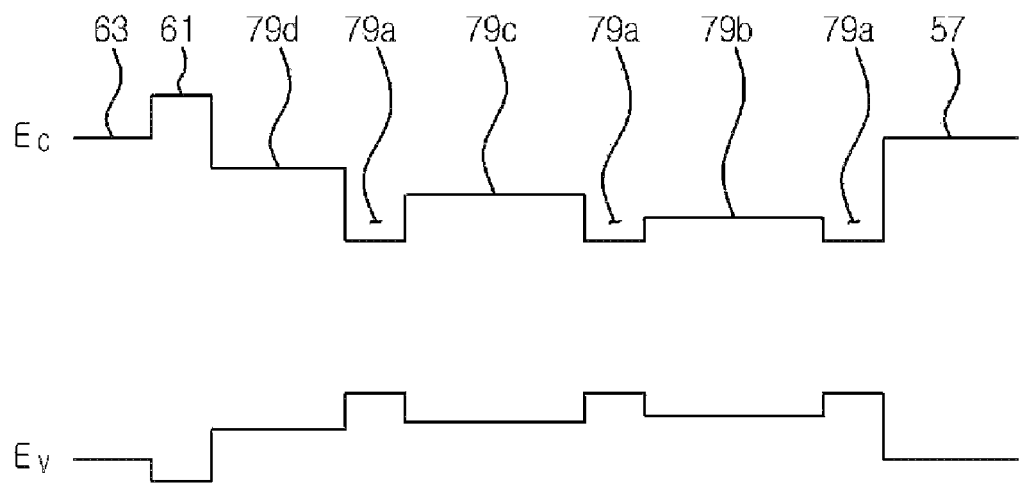
FIG. 11 is a schematic band diagram illustrating the LED having the active region of the multi quantum well structure according to the second embodiment of the present invention.
Figure 12:
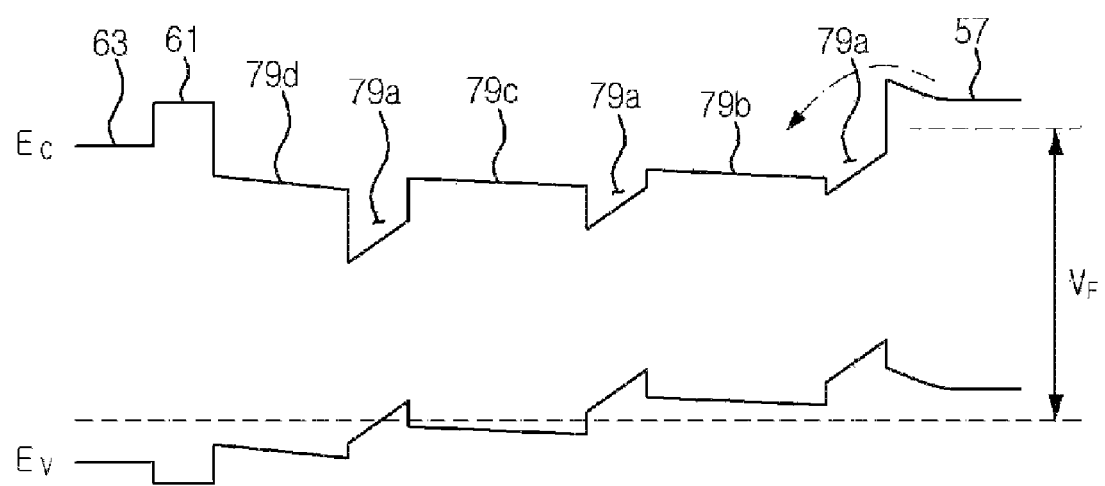
FIG. 12 is a schematic band diagram when a forward voltage is applied to the LED having the active region of the multi quantum well structure according to the second embodiment of the present invention.

FIG. 10 is a sectional view illustrating an LED having an active region of a multi quantum well structure according to a second embodiment of the present invention, and FIG. 11 is a schematic band diagram illustrating the LED having the active region of the multi quantum well structure according to the second embodiment of the present invention. FIG. 12 is a schematic band diagram when a forward voltage is applied to the LED having the active region of the multi quantum well structure according to the second embodiment of the present invention.

Referring to FIG. 10, an N-type compound semiconductor layer 57 is positioned on a substrate 51, and a buffer layer is interposed between the substrate 51 and the N-type compound semiconductor layer 57, wherein the buffer layer comprises a low temperature buffer layer 53 and a high temperature buffer layer 55, as described with reference to FIG. 5. A P-type compound semiconductor layer 63 is positioned on top of the N-type compound semiconductor layer 57. An active region 79 is interposed between the N-type and P-type compound semiconductor layers 57 and 63.

As described with reference to FIG. 5, the N-type and P-type compound semiconductor layers may include (Al, In, Ga)N-based Group-III nitride semiconductor layers, and a blocking layer 61 may be interposed between the P-type compound semiconductor layer 63 and the active region 79. The blocking layer 61 may also be formed of an (Al, In, Ga)N-based Group-III nitride semiconductor, e.g., AlGaN. Also, although not shown, another blocking layer may be interposed between the N-type compound semiconductor layer 57 and the active region 79.

Meanwhile, the active region 79 has a multiple quantum well structure in which well layers 79a and barrier layers 79b, 79c and 79d are alternately laminated. The well layers 79a may be formed of an (Al, In, Ga)N, and a composition element and a composition range of the well layers 79a may be selected depending on the desired wavelength of light. For example, the well layers 79a may be formed of InGaN. The barrier layers 79b, 79c and 79d may be formed of $Al_xIn_yGa_{1-x-y}N$ ($0\leq x$, $y<1$, $0\leq x+y<1$). By varying the composition ratio of Al and/or In, the barrier layers 79b, 79c and 79d can be formed to have a narrower bandgap as the barrier layer is closer to the N-type compound semiconductor layer.

Meanwhile, although the well layer 79a is shown in contact with the N-type compound semiconductor layer 57, the barrier layer 79b may be in contact therewith. Further, although the barrier layer 79d is shown in contact with the blocking layer 61, the well layer 59a may be in contact therewith.

Referring to FIG. 11, the active region 79 of the multiple quantum well structure is positioned between the N-type compound semiconductor layer 57 and the P-type compound semiconductor layer 63 (or blocking layer 61). The active region 79 is formed by alternately laminating the well layers 79a having a relatively narrow bandgap and the barrier layers 79b, 79c and 79d having a relatively wide bandgap.

The barrier layers 79b, 79c and 79d are formed to have a narrower bandgap as the barrier layer is closer to the N-type compound semiconductor layer 57. That is, bandgaps are increased in order of the barrier layer 79b, the barrier layer 79c and the barrier layer 79d. As described above, the barrier layers 79b, 79c and 79d may be formed of $Al_xIn_yGa_{1-x-y}N$ ($0\leq x$, $y<1$, $0\leq x+y<1$). Generally, a bandgap of a barrier layer increases as the composition ratio of Al increases, and a bandgap of a barrier layer decreases as the composition ratio of In increase. Thus, by varying the composition ratio of Al and/or In, the barrier layers can be formed to have a narrower bandgap as the barrier layer is closer to the N-type compound semiconductor layer.

Referring to FIG. 12, if a forward voltage $V_F$ is applied to the LED, bands of the N-type compound semiconductor layer 57 are moved up. If a forward bias that is similar to or higher than the bandgap of the P-type semiconductor layer 63 is applied to the LED, the conduction band Ec of the N-type compound semiconductor layer 57 is positioned higher than that of the P-type compound semiconductor layer 63.

Figure 4:
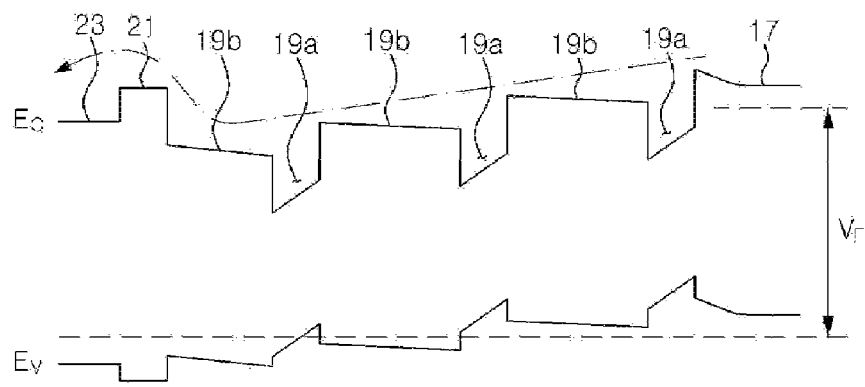
FIG. 4 is a schematic band diagram when a forward voltage is applied to the conventional LED having the active region of the multi quantum well structure.

If a high forward voltage is applied to conventional barrier layers formed of the same material, the conduction band of the barrier layer 19b relatively closer to the N-type semiconductor layer 17 is positioned relatively higher, as shown in FIG. 4. The band slope of these conduction bands provides driving force for allowing carriers (electrons) injected from the N-type semiconductor layer 17 to move toward the P-type semiconductor layer 23, thereby easily generating carrier overflow.

However, in the LED according to the second embodiment of the present invention, since the barrier layer 79b close to the N-type compound semiconductor layer 57 has a narrower bandgap than the barrier layer 79d close to the P-type compound semiconductor layer 63, the band slope of the barrier layers may be decreased even though a high forward voltage is applied to the LED. Particularly, if a forward voltage is applied to the LED, the bandgap of the barrier layers 79b, 79c and 79d can be controlled so that the conduction bands of the barrier layers are positioned at the generally same energy level. Accordingly, removing the driving force inducing carrier overflow in the active region 79 and improving the recombination rate of electrons and holes are possible.

Although the three barrier layers 79b, 79c and 79d have been shown and described in the second embodiment of the present invention, the present invention is not limited thereto. That is, a larger number of the barrier layers may be alternately laminated with the well layers. In this case, the barrier layers are formed so that the barrier layer close to the N-type compound layer 57 has a narrower bandgap than the barrier layer close to the P-type compound semiconductor layer 63.

Meanwhile, in the second embodiment of the present invention, the band diagram is shown, considering that polarization is generated in the well layer by a piezo electric field. Such polarization is generated if GaN-based well and barrier layers are grown in a direction perpendicular to a c-plane, i.e., (0001) plane. However, the present invention is not limited thereto. For example, if GaN-based well and barrier layers are grown in a direction perpendicular to an a- or m-plane, polarization may not be generated. However, the present invention may also be applied to this case.

Meanwhile, the barrier layers may be doped with an n-type impurity. The doping with such an n-type impurity may be limited to a region of a barrier layer. The doping of a region of a barrier layer with an n-type impurity will be described in detail below.

Figure 13:
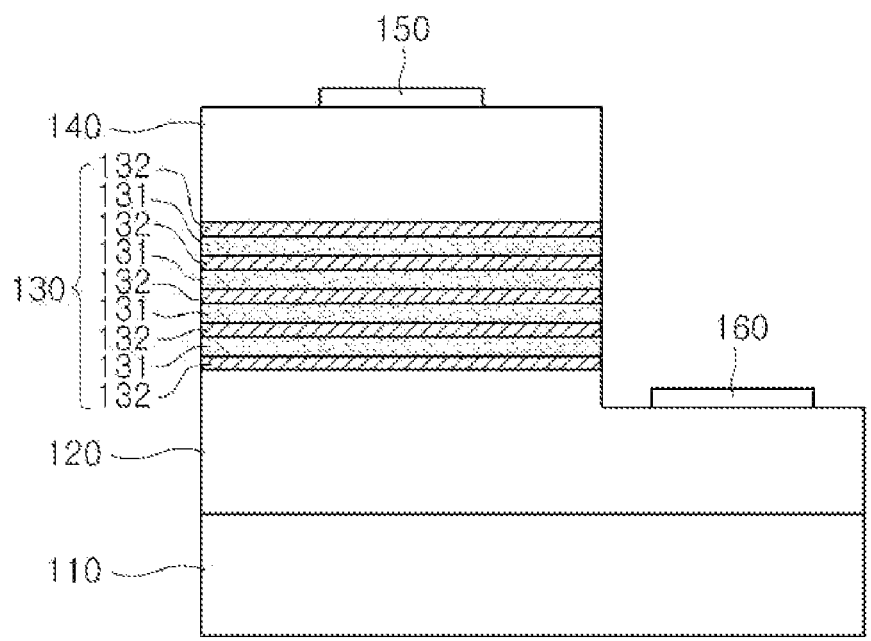
FIG. 13 is a sectional view illustrating an LED having an active region of a multi quantum well structure according to a third embodiment of the present invention.

FIG. 13 is a sectional view illustrating an LED having an active region of a multi quantum well structure according to a third embodiment of the present invention. The LED according to this embodiment has the generally same laminated structure as the LED described with reference to FIG. 5, which will be described in brief. Only the differences will be described in detail.

Referring to FIG. 13, an N-type semiconductor layer 120, an active region 130 and a P-type semiconductor layer 140 are laminated and formed on a substrate 110. A P-electrode 150 is formed on the P-type semiconductor layer 140. After a predetermined region of the N-type semiconductor layer 120 is exposed through a mesa etching process, an N-electrode 160 is formed on the exposed N-type semiconductor layer 120.

The active region 130 is formed to have a multiple quantum well structure by alternately laminating well layers 131 having a narrow energy bandgap and barrier layers 132 having an energy bandgap wider than the well layers 131. At this time, the active region 130 is formed to have a multiple quantum well structure in which the well layers 131 and the barrier layers 132 are alternately laminated twice or more.

As shown, four well layers 131 are interposed between five barrier layers 132. However, the number of the well and barrier layers is not limited thereto but may be variously modified. The well layer 131 may be formed of InGaN, and a bandgap energy is determined depending on the In content of the well layer 131, thereby implementing light with various wavelengths from ultraviolet to infrared. The barrier layer 132 may be formed of GaN. However, the materials of the well and barrier layers 131 and 132 are not limited thereto but may be variously modified.

At least one of the barrier layers 132 is doped with an n-type impurity. At this time, each of the barrier layers is not uniformly doped with the n-type impurity throughout the entire region of the barrier layer, but a region of the barrier layer is doped with the n-type impurity. In this embodiment, Si may be used as the n-type impurity, and $SiH_4$, $Si_2H_6$ or the like may be used as a source of Si. However, the n-type impurity is not limited to Si, but Ge, Sn, Te, S or the like may be used as the n-type impurity.

If the barrier layer is doped with an n-type impurity, the piezo electric field formed in the well layer is reduced, thereby increasing luminous efficiency. However, the n-type impurity with which the barrier layer is doped allows a surface of the barrier layer to be rough, so the film quality of the barrier layer may deteriorate. For this reason, if the active region of the multiple quantum well structure is formed to be very thin, forming the barrier and well layers with a uniform thickness is difficult.

Therefore, if a region of the barrier layer is doped with an n-type impurity as described in this embodiment, the electrical characteristics, including the increased recombination rate of electrons and holes caused by reducing the piezo electric field of the well layer, are improved, and the film quality of the barrier layer can be improved by restraining unnecessary doping with the n-type impurity, so that luminous efficiency of the LED can be improved.

Hereinafter, various embodiments of barrier layers non-symmetrically doped with an n-type impurity will be described.

Figure 14:
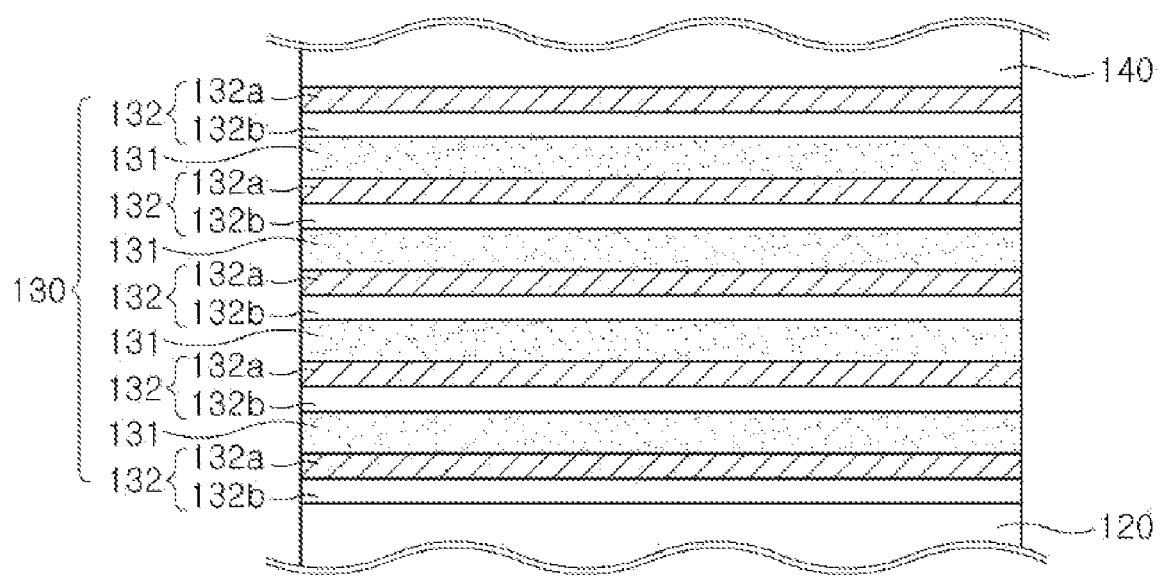
FIG. 14 is a sectional view illustrating the active region of the LED according to the third embodiment of the present invention.
Figure 15:
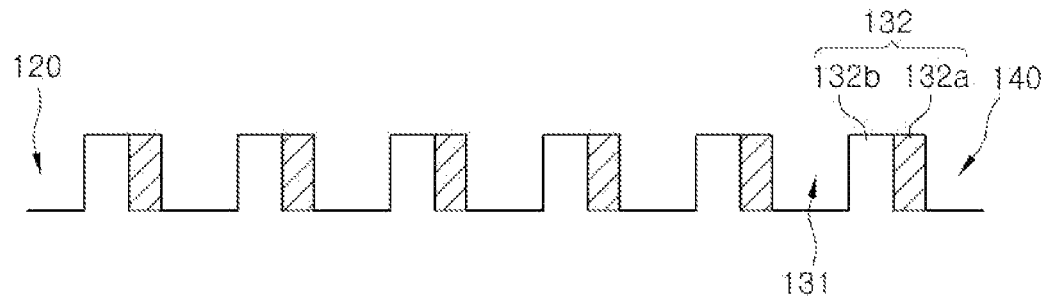
FIG. 15 is a view illustrating a doped state of a barrier layer of the LED according to the third embodiment of the present invention.

FIG. 14 is a sectional view illustrating the active region of the LED according to the third embodiment, and FIG. 15 is a view illustrating a doped state of a barrier layer of the LED according to the third embodiment.

Referring to FIGS. 14 and 15, the LED has an active region 130 formed on an N-type semiconductor layer 120, and a P-type semiconductor layer 140 formed on the active region 130. The active region 130 is formed to have a multiple quantum well structure in which well layers 131 and barrier layers 132 are alternately laminated twice or more.

A first region 132a of the barrier layer 132 is doped with an n-type impurity, and a second region 132b of the barrier layer 132 is undoped. That is, the barrier layer 132 is not uniformly doped with an n-type impurity throughout the entire region of the barrier layer 132, but a region (i.e., the first region 132a) of the barrier layer 132 is doped with an n-type impurity, so that the barrier layer 132 is non-symmetrically doped with an n-type impurity.

At this time, the first region 132a may be formed adjacent to one surface of the barrier layer 132, i.e., a surface facing to the P-type semiconductor layer, and the second region 132b may be formed adjacent to the other surface of the barrier layer 132, i.e., a surface facing to the N-type semiconductor layer. That is, an upper region of each barrier layer 132 is the first region 132a, which is doped with an n-type impurity, and a lower region of each barrier layer 132 is a second region 132b, which is undoped.

The concentration of the n-type impurity with which the first region 132a of the barrier layer 132 doped may be $10^{18}/cm^3$ to $10^{19}/cm^3$. The thickness of the second region 132b may be 1.5 to 20 times thicker than the first region 132a.

Meanwhile, the concentration of the n-type impurity with which the first region of the barrier layer adjacent to the P-type semiconductor layer 140 is doped may be lower than that of the n-type impurity with which the first region of the other barrier layers is doped.

Figure 16:
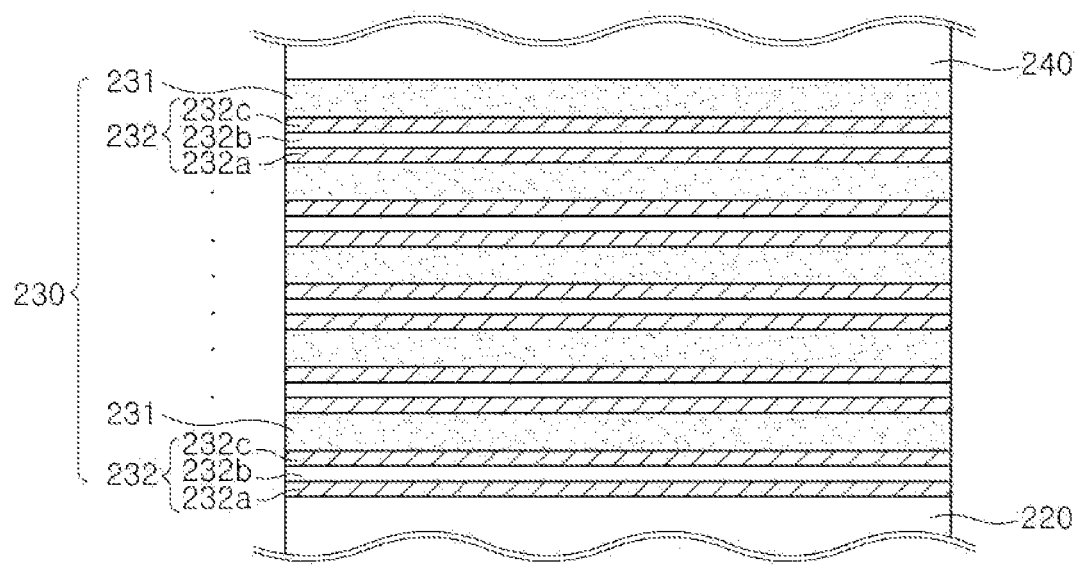
FIG. 16 is a sectional view illustrating an active region of an LED according to a modification of the third embodiment of the present invention.
Figure 17:
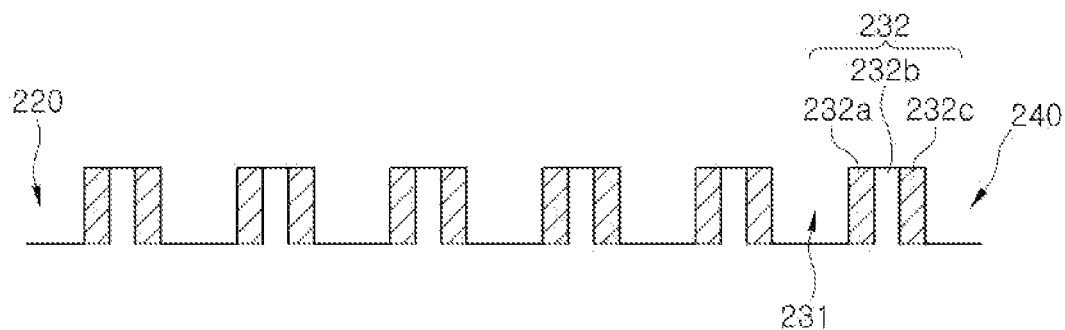
FIG. 17 is a view illustrating a doped state of a barrier layer of the LED according to the modification of the third embodiment of the present invention.

FIG. 16 is a sectional view illustrating an active region of an LED according to a modification of the third embodiment of the present invention, and FIG. 17 is a view illustrating a doped state of a barrier layer of the LED according to the modification of the third embodiment of the present invention.

Referring to FIGS. 16 and 17, the LED has an active region 230 formed on an N-type semiconductor layer 220, and a P-type semiconductor layer 240 formed on the active region 230. The active region 230 is formed to have a multiple quantum well structure in which well layers 231 and barrier layers 232 are alternately laminated twice or more.

First regions 232a and 232c of the barrier layer 232 are doped with an n-type impurity, and a second region 232b is undoped. That is, the barrier layer 232 is not uniformly doped with the n-type impurity throughout the entire region of the barrier layer 232, but regions (i.e., the first regions 232a and 232c) of the barrier layer 232 are doped with an n-type impurity.

At this time, the first regions 232a and 232c are respectively formed adjacent to one and the other surfaces of the barrier layer 232, and the second region 232b is interposed between the first regions 232a and 232c. That is, the first region 232a is formed adjacent to one surface of the barrier layer 232, i.e., a surface facing to the P-type semiconductor layer; the first region 232c is formed adjacent to the other surface of the barrier layer 232, i.e., a surface facing to the N-type semiconductor layer; and the second region 232b is formed between the first regions 232a and 232c.

At this time, the concentration of the n-type impurity with which the first regions 232a and 232c of the barrier layer 232 is doped may be $10^{18}/cm^3$ to $10^{19}/cm^3$, and the thickness of the second region 232b may be 1.5 to 20 times thicker than the total thickness of the first regions 232a and 232c.

Figure 18:
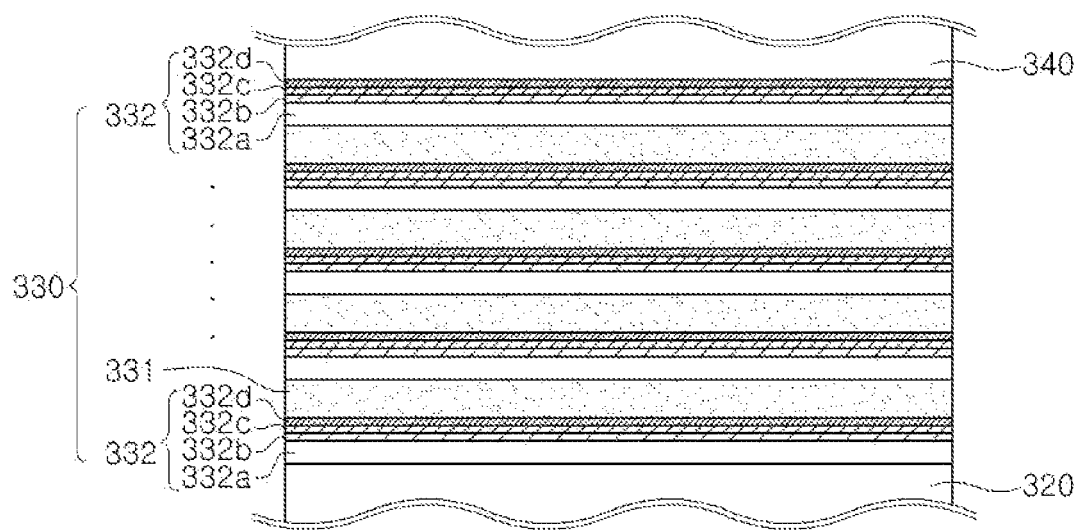
FIG. 18 is a sectional view illustrating an active region of an LED according to another modification of the third embodiment of the present invention.
Figure 19:
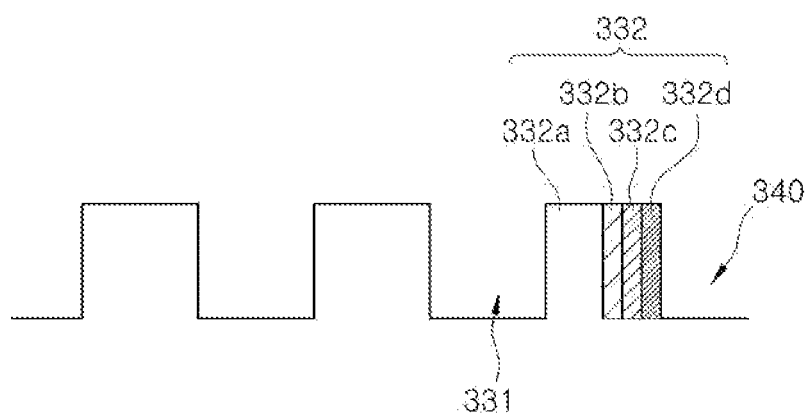
FIG. 19 is a view illustrating a doped state of a barrier layer of the LED according to the other modification of the third embodiment of the present invention.

FIG. 18 is a sectional view illustrating an active region of an LED according to another modification of the third embodiment of the present invention, and FIG. 19 is a view illustrating a doped state of a barrier layer of the LED according to another modification of the third embodiment of the present invention.

Referring to FIGS. 18 and 19, the LED has an active region 330 formed on an N-type semiconductor layer 320, and a P-type semiconductor layer 340 formed on the active region 330. The active region 330 is formed to have a multiple quantum well structure in which well layers 331 and barrier layers 332 are alternately laminated twice or more.

A first region of the barrier layer 332 comprises a first layer 332b, a second layer 332c and a third layer 332d, wherein the first to third layers 332b, 332c and 332d of the first region are doped with an n-type impurity, and a second region 332a is undoped.

At this time, the third layer 332d of the first region is formed adjacent to one surface of the barrier layer 332, i.e., a surface facing to the P-type semiconductor layer, and the second region 332a is formed adjacent to the other surface of the barrier layer 332, i.e., a surface facing to the N-type semiconductor layer.

The first to third layers 332b, 332c and 332d of the first region are doped with n-type impurities with different concentrations, respectively. As the layer of the first region is closer to the P-type semiconductor layer 340 or well layer 331, the concentration of the n-type impurity may be increased. In this embodiment, the concentration of the n-type impurity is increased in order of the first layer 332b, the second layer 332c and the third layer 332d. At this time, the concentration of the n-type impurity may be $10^{18}/cm^3$ to $10^{19}/cm^3$.

FIGS. 20 to 24 are sectional views illustrating a method of fabricating the LED according to the third embodiment of the present invention.

Figure 20:
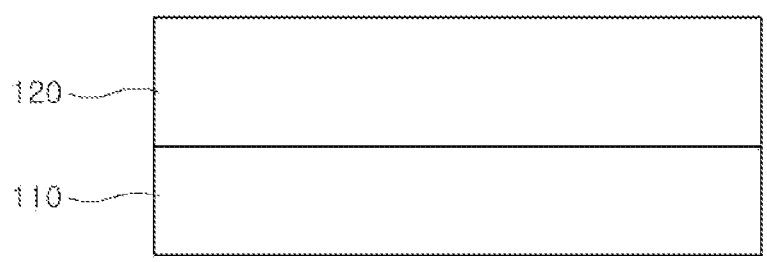
FIGS. 20 to 24 are sectional views illustrating a method of fabricating the LED according to the third embodiment of the present invention.

Referring to FIG. 20, a substrate 110 is first prepared, and an N-type semiconductor layer 120 is formed on the substrate 110. A variety of materials such as sapphire or silicon carbide (SiC) may be used as a material of the substrate 110.

In the third embodiment, the N-type semiconductor layer 120 may be formed of N-type GaN. However, the N-type semiconductor layer is not limited thereto but may be formed of nitride-based compounds with various compositions. Further, the n-type impurity may include Si. However, the n-type impurity is not limited thereto but may include Ge, Sn, Te, S and the like.

Figure 21:
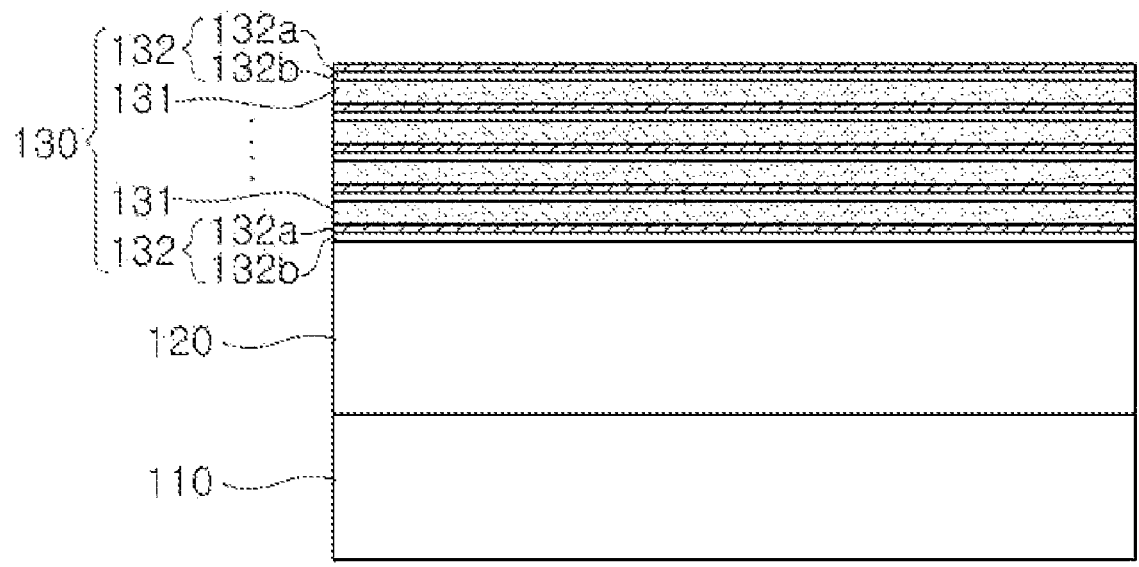

Referring to FIG. 21, an active region 130 is formed on the N-type semiconductor layer 120. The active region 130 is formed to have a multiple quantum well structure in which well layers 131 and barrier layers 132 are alternately laminated twice or more. A first region 132a of the barrier layer 132 is doped with an n-type impurity, and a second region 132b is undoped.

Figure 22:
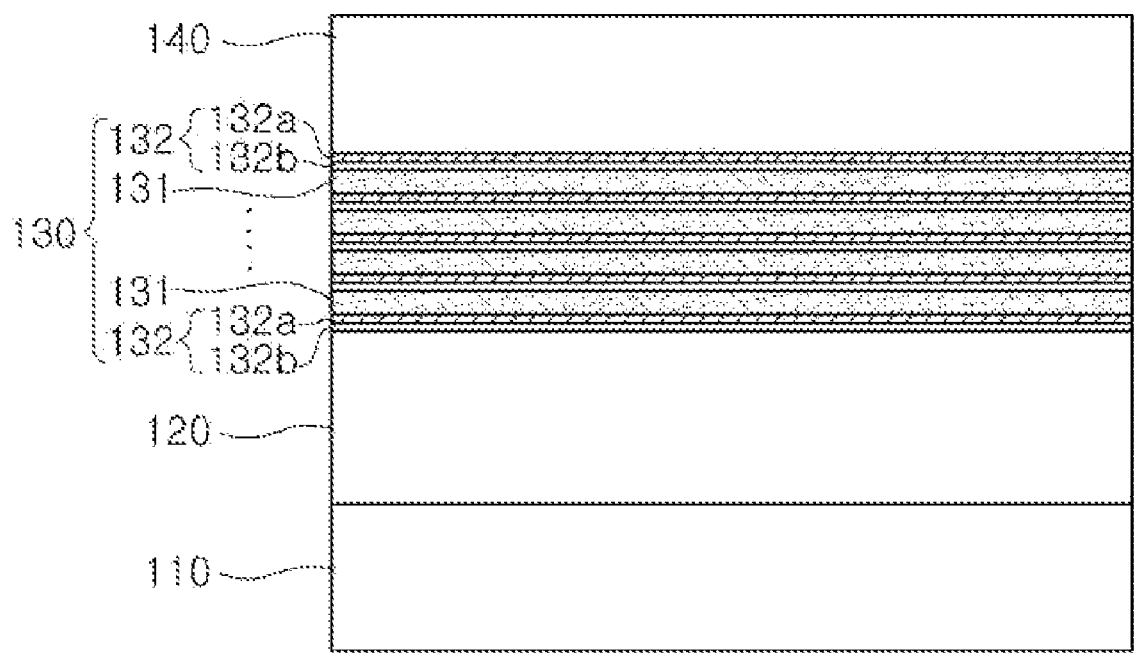

Referring to FIG. 22, a P-type semiconductor layer 140 is formed on the active region 130. In this embodiment, the P-type semiconductor layer 140 may be formed of P-type GaN. However, the P-type semiconductor layer is not limited thereto but may be formed of nitride-based compounds with various compositions. Further, the P-type impurity may include Zn, Cd, Be, Mg, Ca, Sr, Ba and the like, but is not limited thereto.

Figure 23:
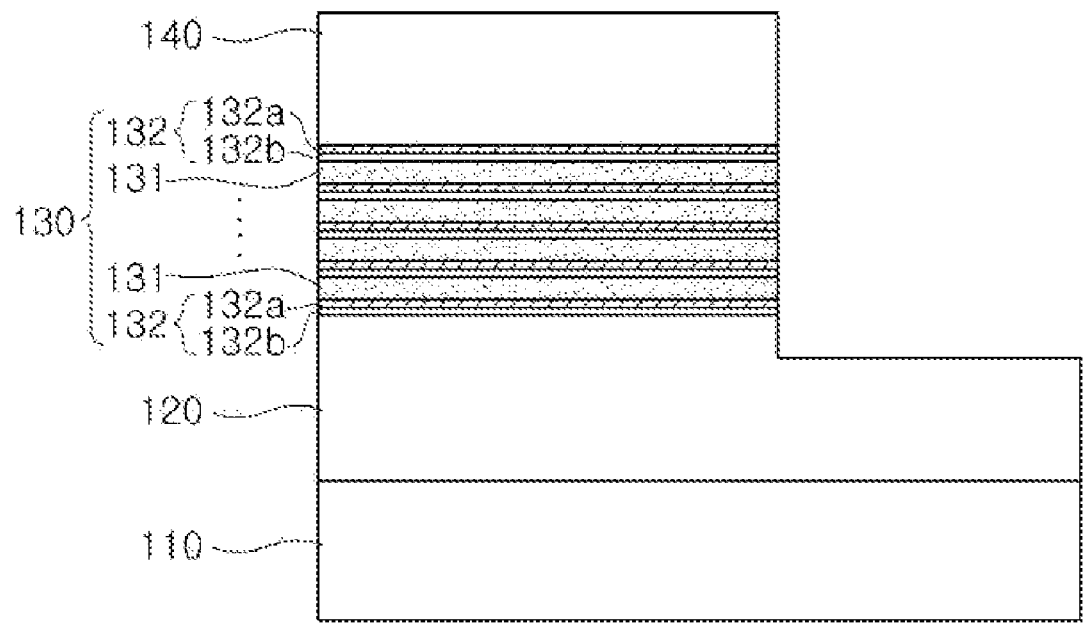
Figure 24:
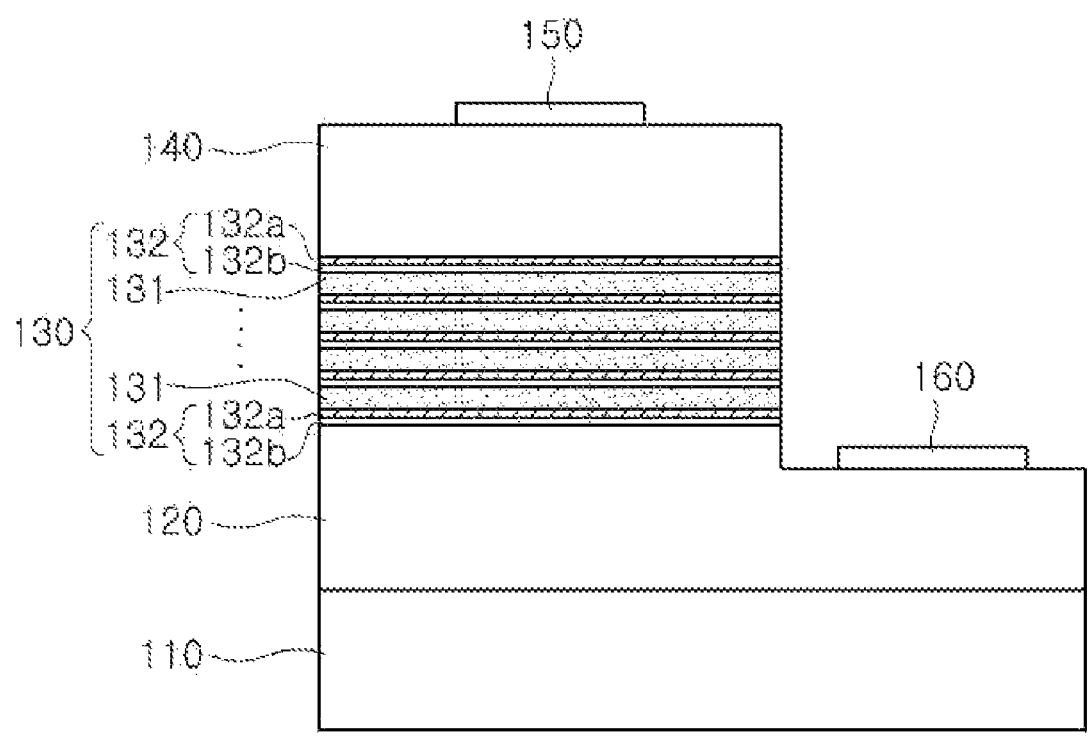

Referring to FIGS. 23 and 24, after a mesa etching process is performed on the P-type semiconductor layer 140 up to a portion of the N-type semiconductor layer 120, a P-electrode 150 is formed on the P-type semiconductor layer 140, and an N-electrode 160 is formed on the exposed region of the N-type semiconductor layer 120, thereby completing an LED.

According to the exemplary embodiments of the present invention, an LED is provided with improved luminous efficiency by increasing the recombination rate of electrons and holes. Further, positions at which electrons and holes are recombined in a multiple quantum well structure of the LED can be controlled using a middle barrier layer having a relatively wide bandgap. Particularly, the middle barrier is disposed at a central portion of the multiple quantum well structure, thereby providing an LED with an increased recombination rate of electrons and holes. Accordingly, non-light emitting recombination generated in the vicinity of a P-type compound semiconductor layer or P-type clad layer is decreased, whereby the luminous efficiency of the LED can be enhanced.

In addition, an LED is provided in which driving force for generating carrier overflow is removed by controlling a bandgap of barrier layers, so that the recombination of electrons and holes can be enhanced in the active region. Further, polarization generated by a piezo electric field can be reduced by employing a barrier layer having a impurity doped region and an undoped region, and the crystalline quality of the barrier layer and/or the well layer can be improved by minimizing unnecessary impurity doping.

Although a variety of embodiments of a light emitting diode and a manufacturing method thereof according to the present invention has been described, the embodiments of are introduced only for the illustrative purpose of helping understand the light emitting diode and the manufacturing method thereof according to the present invention. It will be apparent to those skilled in the art that various modifications and variations can be made in the present invention without departing from the spirit or scope of the invention. Thus, the present invention is intended to cover the modifications and variations of this invention provided they come within the scope of the appended claims and their equivalents.

What is claimed is:

1. A light emitting diode (LED), comprising:
a GaN-based N-type compound semiconductor layer;
a GaN-based P-type compound semiconductor layer;
an active region of a multi quantum well structure having well layers and barrier layers alternately laminated, the active region being interposed between the N-type compound semiconductor layer and the P-type compound semiconductor layer; and
a first middle barrier layer positioned between a first barrier layer adjacent to the N-type compound semiconductor layer and a n-th barrier layer adjacent to the P-type compound semiconductor layer, the first middle barrier layer having a bandgap wider than the first barrier layer and the n-th barrier layer.

2. The LED as claimed in claim 1, wherein the first middle barrier layer is positioned at a central portion between the first barrier layer and the n-th barrier layer.

3. The LED as claimed in claim 1, further comprising a second middle barrier layer positioned between the first barrier layer and the first middle barrier layer and having a bandgap relatively wider than the first barrier layer and the n-th barrier layer.

4. The LED as claimed in claim 3, wherein at least one barrier layer having a bandgap relatively narrower than the first middle barrier layer and the second middle barrier layer is positioned between the first middle barrier layer and the second middle barrier layer.

5. The LED as claimed in claim 3, wherein the second middle barrier layer has a bandgap relatively narrower than the first middle barrier layer.

6. The LED as claimed in claim 1, wherein the first barrier layer and the n-th barrier layer are formed of $In_xAl_yGa_zN$ ($0<x<1$, $0\leq y<1$, $0<z<1$) or GaN; and the first middle barrier layer is formed of AlGaN.

7. The LED as claimed in claim 1, wherein the first middle barrier layer has a laminated structure in which a layer having a relatively wide bandgap is interposed between layers having a relatively narrow bandgap.

8. The LED as claimed in claim 1, wherein each of the layers having a relatively narrow bandgap is formed of $In_xAl_yGa_zN$ ($0<x<1$, $0\leq y<1$, $0<z<1$) or GaN; and the layer having a relatively wide bandgap is formed of AlGaN.

9. The LED as claimed in claim 1, wherein at least one of the barrier layers comprises a first region doped with an n-type impurity and an undoped second region.

10. The LED as claimed in claim 9, wherein the first region is formed adjacent to a first surface of the barrier layer, and the second region is formed adjacent to a second surface of the barrier layer.

11. The LED as claimed in claim 10, wherein the first surface of the barrier layer faces the P-type compound semiconductor layer, and the second surface of the barrier layer faces the N-type compound semiconductor layer.

12. The LED as claimed in claim 11, wherein the first region has an increasing concentration of the doped n-type impurity toward the first surface of the barrier layer.

13. The LED as claimed in claim 9, wherein two first regions are respectively formed adjacent to a first surface and a second surface of the barrier layer, and the second region is formed between the first regions.

14. The LED as claimed in claim 9, wherein the thickness of the second region is 1.5 to 20 times thicker than the first region.

15. The LED as claimed in claim 9, further comprising:
a second barrier layer,
wherein the n-th barrier layer is adjacent to the P-type compound semiconductor layer, and the n-th barrier layer and the second barrier layer each comprise the first region and the second region, and
the first region of the n-th barrier layer has an impurity concentration lower than the first region of the second barrier layer.

16. An LED, comprising:
a GaN-based N-type compound semiconductor layer;
a GaN-based P-type compound semiconductor layer;
an active region of a multi quantum well structure having well layers and barrier layers alternately laminated, the active region being interposed between the N-type compound semiconductor layer and the P-type compound semiconductor layer,
wherein a first barrier layer in the active region has a narrower bandgap closer to the N-type compound semiconductor layer.

17. The LED as claimed in claim 16, wherein the barrier layers are formed of $Al_xIn_yGa_{1-x-y}N$ ($0\leq x$, $y<1$, $0\leq x+y<1$).

18. The LED as claimed in claim 17, wherein the well layers are formed of InGaN.

19. The LED as claimed in claim 16, further comprising a blocking layer between the P-type compound semiconductor layer and the active region.

20. The LED as claimed in claim 19, wherein the blocking layer is formed of AlGaN.

21. The LED as claimed in claim 16, wherein if a forward operation voltage is applied, conduction bands of the barrier layers are positioned at the generally same energy level.

22. The LED as claimed in claim 16, wherein at least one of the barrier layers comprises a first region doped with an n-type impurity and an undoped second region.

23. The LED as claimed in claim 22, wherein the first region is formed adjacent to a first surface of the barrier layer, and the second region is formed adjacent to a second surface of the barrier layer.

24. The LED as claimed in claim 23, wherein the first surface of the barrier layer faces the P-type compound semiconductor layer, and the second surface of the barrier layer faces the N-type compound semiconductor layer.

25. The LED as claimed in claim 24, wherein the first region has an increasing concentration of the doped n-type impurity toward the first surface of the barrier layer.

26. The LED as claimed in claim 22, wherein two first regions are respectively formed adjacent to the first surface and the second surface of the barrier layer, and the second region is formed between the first regions.

27. The LED as claimed in claim 22, wherein the thickness of the second region is 1.5 to 20 times thicker than the first region.

28. The LED as claimed in claim 22, further comprising:
a second barrier layer adjacent to the P-type compound semiconductor layer; and
a third barrier layer,
wherein the second barrier layer and the third barrier layer each comprise the first region and the second region, and
the first region of the second barrier layer has an impurity concentration lower than the first region of the third barrier layer.

29. The LED as claimed in claim 3, wherein the first middle barrier layer has a laminated structure in which a layer having a relatively wide bandgap is interposed between layers having a relatively narrow bandgap.

* * * * *